(12) United States Patent
Muraoka et al.

(10) Patent No.: US 8,646,504 B2
(45) Date of Patent: Feb. 11, 2014

(54) ADHESIVE TAPE AFFIXING EQUIPMENT AND PRESS-FITTING EQUIPMENT

(75) Inventors: Nobuhiko Muraoka, Yamanashi (JP); Syozo Kadota, Yamanashi (JP)

(73) Assignee: Panasonic Corporation, Osaka (JP)

( * ) Notice: Subject to any disclaimer, the term of this patent is extended or adjusted under 35 U.S.C. 154(b) by 118 days.

(21) Appl. No.: 13/122,172

(22) PCT Filed: Jan. 18, 2010

(86) PCT No.: PCT/JP2010/000240
§ 371 (c)(1),
(2), (4) Date: Apr. 1, 2011

(87) PCT Pub. No.: WO2010/084728
PCT Pub. Date: Jul. 29, 2010

(65) Prior Publication Data
US 2011/0186235 A1    Aug. 4, 2011

(30) Foreign Application Priority Data
Jan. 22, 2009    (JP) .................................. 2009-012269

(51) Int. Cl.
  *B32B 37/10*    (2006.01)
  *B32B 37/02*    (2006.01)
  *B32B 37/12*    (2006.01)

(52) U.S. Cl.
  USPC ........................................................ 156/538

(58) Field of Classification Search
  USPC ........................................................ 156/538
  IPC .................................. B32B 37/10,37/02, 37/12
  See application file for complete search history.

(56) References Cited

U.S. PATENT DOCUMENTS

| | | | | |
|---|---|---|---|---|
| 4,954,207 | A | * | 9/1990 | Higuchi et al. ............... 156/552 |
| 2004/0069400 | A1 | * | 4/2004 | Onoshiro et al. ............. 156/238 |
| 2009/0321006 | A1 | * | 12/2009 | Odawara et al. ............. 156/251 |
| 2010/0126654 | A1 | * | 5/2010 | Katayama et al. ............ 156/159 |

FOREIGN PATENT DOCUMENTS

| | | |
|---|---|---|
| JP | 09-039107 A | 2/1997 |
| JP | 10-027820 B2 | 1/1998 |

(Continued)

OTHER PUBLICATIONS

International Search Report for PCT/JP2010/000240 dated Mar. 16, 2010.

*Primary Examiner* — Philip Tucker
*Assistant Examiner* — Shawn F Hogan
(74) *Attorney, Agent, or Firm* — Pearne & Gordon LLP

(57) ABSTRACT

An adhesive tape affixing equipment for pulling out a tape from a supply reel on which the tape constructed by laminating an adhesive tape on a separator tape is wound, and then affixing the adhesive tape onto predetermined locations of a substrate by pushing the tape using a press-fitting tool. A radial direction of the supply reel is arranged to intersect substantially orthogonally with a longitudinal direction of the press-fitting tool during the affixing of the adhesive tape by the press-fitting tool. Also included is a tape running route setting device for causing the tape pulled out from the supply reel to run through an area between the press-fitting tool and the substrate along the longitudinal direction of the press-fitting tool via a tape running direction changing portion being provided to at least one location.

13 Claims, 12 Drawing Sheets

(56) References Cited

FOREIGN PATENT DOCUMENTS

| | | | |
|---|---|---|---|
| JP | 2001-168145 B2 | 6/2001 | |
| JP | 2008-242400 A | 10/2008 | |
| TW | 200822244 A | 5/2008 | |
| WO | 2006/038384 A1 | 4/2006 | |
| WO | WO 2008038557 A1 * | 4/2008 | .............. H01L 21/60 |

* cited by examiner

FIG. 7
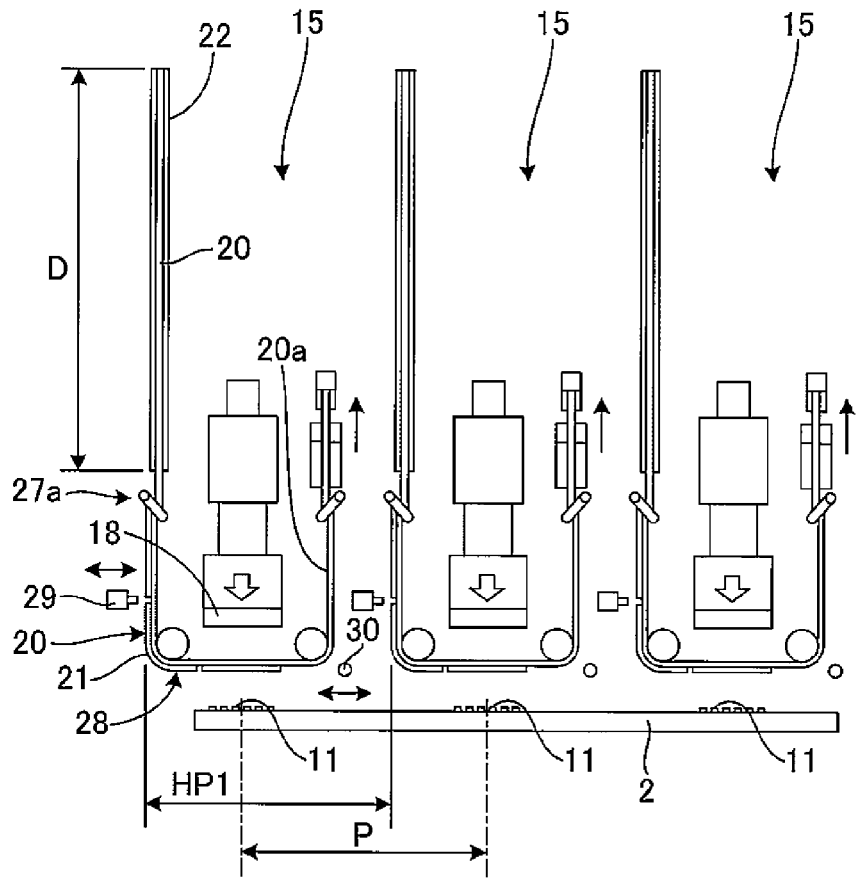
FIG. 8A
FIG. 8B
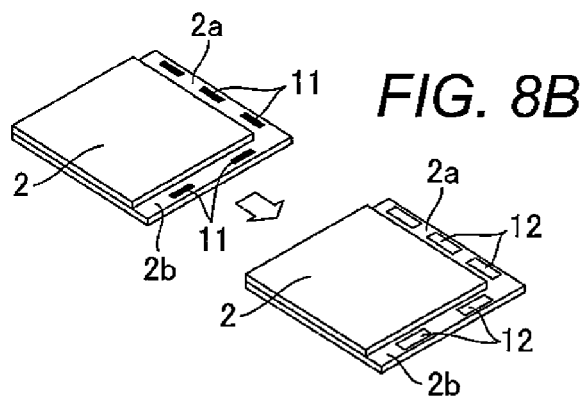

ADHESIVE TAPE AFFIXING EQUIPMENT AND PRESS-FITTING EQUIPMENT

TECHNICAL FIELD

The present invention relates to an adhesive tape affixing equipment for affixing an adhesive tape such as an anisotropic conductive tape, or the like to predetermined locations of a substrate in the step of mounting an electronic component on a substrate such as a display panel, an electronic circuit board, or the like, and a press-fitting equipment for press-fitting a press-fitted component such as an electronic component, or the like.

BACKGROUND ART

As the method of mounting an electronic component on a substrate, a method of employing an anisotropic conductive tape (abbreviated as "ACF" hereinafter) is known. That is, such a method is known that, as shown in FIG. 13(a), an ACF 51 laminated on a separator tape 50 is positioned over electrodes 54 of a substrate 53 loaded on a stage 52 to oppose to the electrodes 54, then, as shown in FIG. 13(b), the ACF affixing step of affixing the ACF 51 onto the electrodes 54 of the substrate 53 is executed by pushing the ACF 51 against the electrodes 54 of the substrate 53 from the top of the separator tape 50 by means of a pressure applying tool 55, then the electrodes of the electronic component are aligned with the electrodes 54 of the substrate 53 and the electronic component is fitted to the electrodes via the ACF 51, and then the electrodes are joined together by applying a heat and a pressure.

In the ACF affixing equipments for performing the above ACF affixing step, there is known the equipment that affixes collectively the ACF 51 whose length is substantially equal to a length of the side edge portion of the substrate 53 on which a plurality of electrodes 54 are provided. In this case, such a problem existed that, when an alignment pitch interval of the electrodes 54 is larger than a length of the electrodes 54, the ACF 51 is consumed wastefully and a cost is increases because the ACF 51 is expensive. Therefore, as shown in FIG. 13, there is known the equipment that repeats the action, which cuts the ACF 51 into a length corresponding to the length of the electrodes 54 and affixes the cut ACF onto each electrode 54, plural time in response to the number of electrodes 54 arranged on the side edge portion of the substrate 53 (see Patent Literature 1, for example).

Also, there is known the equipment that is equipped with two affixing units for affixing the ACF onto the electrodes of the substrate, wherein the alignment pitch between these affixing units can be adjusted to meet the alignment pitch interval of the electrodes on the substrate such that the ACF can be affixed at a time onto two electrodes of the substrate (see Patent Literature 2, for example).

As a configurative example of this type ACF affixing equipment, as shown in FIG. 14, there is considered the equipment that is equipped with affixing units 60 for unwinding a tape 61 whose ACF 61a is stacked on a separator tape from a supply reel 62, then supplying this tape 61 to an area between the pressure applying tool 63 and the side edge portions, on which electrodes 66 are arranged respectively, of a substrate 65 via guide rollers 64a, 64b arranged on both sides of a pressure applying tool 63, then affixing the ACF 61a onto the electrodes 66 by pushing the ACF 61a against the electrodes 66 of the substrate 65 via the separator tape by the pressure applying tool 63, and then pitch-feeding the separator tape by a pitch feeding means 67 after the ACF affixing is made and also ejecting the separator tape from an eject duct 68 to the outside, wherein a plurality of affixing units 60 are aligned in parallel such that their mutual pitch interval can be set adjustably. Here, 69 denotes a cutter for cutting the ACF just before the guide roller 64a on the supply reel side to correspond to a length of the electrode, and 70 denotes a releasing mechanism that is moved back and forth in an area between the pressure applying tool 63 and the substrate 65 to release the separator tape from the ACF 61a after the ACF 61a is affixed onto the electrodes 66.

In the configuration set forth in Patent Literature 2, in two affixing units being arranged in parallel, respective pressure applying tools are provided to the portions that are located closely mutually, and also the supply reels, the recovery reels, and the tape running routes between them are provided in a bilaterally symmetrical fashion with respect to an intermediate line between two affixing units.

Prior Technical Literature

Patent Literatures

Patent Literature 1: Japanese Patent No. 3284891
Patent Literature 2: Japanese Patent No. 3821623

SUMMARY OF THE INVENTION

Problems that the Invention is to Solve

However, in the configuration shown in FIG. 14, even though the affixing unit 60 is constructed such that width dimensions of its major mechanism portions are minimized, when the supply reel 60 on which the tape 61 whose length enables an exchange interval of the tape 61 to be extended to some extent is wound is applied, an alignment pitch HP2 of a plurality of affixing units 60 is restricted by the diameter D. As a result, an alignment pitch HP2 of the affixing units 60 is increased larger than a pitch P between the electrodes 66, 66 on the substrate 65. Therefore, in the step of affixing the ACF 61a on a plurality of electrodes 66 that are provided at the pitch P on the side edge portion of the substrate 65, the ACF 61a cannot be affixed simultaneously collectively by a plurality of affixing units 60, and thus a working time required for the ACF affixing step is extended. As a consequence, such problems exist that a working time required for the ACF affixing step is prolonged and such working time acts as the impediment in the working efficiency improvement.

Here, in the ACF affixing equipment set forth in Patent Literature 2, even when the pitch between two adjacent electrodes on the substrate is small, the ACF can be affixed simultaneously collectively onto the adjacent electrodes by the press-fitting heads of two affixing units. In this case, when three electrodes or more are aligned in parallel at the similar pitch, such problems exist that the ACF cannot be affixed simultaneously collectively, which acts as the impediment in the working efficiency improvement.

Also, in the press-fitting equipment for press-fitting the electronic component being mounted onto the electrodes of the substrate via the ACF or the adhesive material while applying a heat and a pressure, when the protection tape is interposed between the press-fitting tool and the electronic component and then the electronic component is press-fitted in a state that the protection tape is interposed, such a situation can be prevented that the protruded ACF or adhesive material adheres onto the press-fitting tool to contaminate it, and/or the variation in parallelism between the press-fitting tool and the substrate can be absorbed. In such equipment, the similar problems arise because the alignment pitch of a plurality of press-fitting units is restricted by the diameter of the protection tape supply reel.

The present invention has been made in view of the problems in the prior art, and it is an object of the present invention to provide an adhesive tape affixing equipment and a press-fitting equipment capable of affixing an ACF or other adhesive tape onto a plurality of predetermined locations that are aligned in parallel on a substrate, or executing effectively an operation for press-fitting a press-fitted component.

Means for Solving the Problems

An adhesive tape affixing equipment of the present invention pulls out a tape from a supply reel on which the tape constructed by laminating an adhesive tape on a separator tape is wound, and then affixes the adhesive tape onto predetermined locations of a substrate by pushing the tape by means of a press-fitting tool, wherein the supply reel is arranged to intersect substantially orthogonally with a longitudinal direction of the press-fitting tool, and a tape running route setting means for causing the tape pulled out from the supply reel to run through an area between the press-fitting tool and the substrate along the longitudinal direction of the press-fitting tool via a tape running direction changing portion being provided to at least one location.

According to this configuration, the supply reel is arranged to intersect substantially orthogonally with the longitudinal direction of the press-fitting tool. Therefore, a width dimension of the press-fitting tool along the longitudinal direction can be constructed compactly even when the supply reel whose diameter is large is applied, and also the exchange interval of the tape can be prolonged since the supply reel containing the tape in a sufficient length can be applied. Thus, the interruption of production caused due to the tape exchange can be reduced, and also a working efficiency can be improved. Further, the direction of the tape unwound from the supply reel is changed into the longitudinal direction of the press-fitting tool by the tape running direction changing portion, and then the tape can be supplied to the area between the press-fitting tool and the substrate. Therefore, the adhesive tape can be affixed properly and stably onto the predetermined locations of the substrate. As a result, such advantages can be achieved, even when the adhesive tape is affixed onto a plurality of predetermined locations that are aligned in parallel at a small pitch interval on the substrate, the tape can be affixed with good working efficiency.

Also, the tape running direction changing portion is arranged on an inner side of a tape running route on a press-fitting tool side, when viewed from a tape side, in a tape running route that reaches the press-fitting tool from the supply reel. Therefore, the direction of the tape is changed while the tape running direction changing portion contacts the separator tape side of the tape, and thus the direction of the tape can be changed properly not to exert the influence on the adhesive tape.

Also, the tape running direction changing portion is constructed by oblique rollers that are rotated around an axis center being inclined to both running surfaces of the tape on a supply reel side and a press-fitting head side. Therefore, the direction of the tape can be changed properly by a simple configuration that is obtained by arranging obliquely the roller.

Also, a plurality of affixing units, each including the press-fitting tool, a press-fitting tool operating means for causing the press-fitting tool to execute pressurizing and separating operations that are applied to affix an adhesive tape onto predetermined locations of the substrate, the supply reel, the tape running route setting means, and a tape running means for executing a feed of the tape, are provided to move and position independently respectively. Therefore, the adhesive tape can be affixed at a time onto a plurality of predetermined locations, and also such a situation can be easily handled that the kind of the substrate is changed.

Also, three affixing units or more are aligned in one row in a carrying direction of the substrate. Therefore, even when three electrodes or more are aligned in parallel on the side edge portions of the substrate, the adhesive tape can be affixed onto the electrodes respectively. Also, a plurality of affixing units enable the press-fitting tools simultaneously to operate respectively. Therefore, the adhesive tape can be affixed simultaneously collectively onto respective electrodes.

Also, a protection tape supply reel on which a protection tape that is interposed between the press-fitting tool and the tape is wound is arranged to intersect substantially orthogonally with the longitudinal direction of the press-fitting tool, and a protection tape running route setting means for causing the protection tape being pulled out from the protection tape supply reel to run through an area between the press-fitting tool and the tape along the longitudinal direction of the press-fitting tool via the tape running direction changing portion provided to at least one location is provided. Therefore, even when the protection tape is provided in addition, the above advantages can be achieved.

Also, a press-fitting equipment of the present invention pulls out a protection tape from a protection tape supply reel on which the protection tape is wound, and then press-fits a press-fitted component to a substrate via the protection tape by a press-fitting tool, wherein the protection tape supply reel is arranged to intersect substantially orthogonally with a longitudinal direction of the press-fitting tool, and a protection tape running route setting means for causing the protection tape being pulled out from the protection tape supply reel to run through an area between the press-fitting tool and the press-fitted component along the longitudinal direction of the press-fitting tool via the tape running direction changing portion provided to at least one location is provided. Therefore, the above advantages can be achieved in the press-fitting equipment in which the protection tape is applied.

Advantages of the Invention

According to the adhesive tape affixing equipment of the present invention, the supply reel is arranged to intersect substantially orthogonally with the longitudinal direction of the press-fitting tool. Therefore, a width dimension of the press-fitting tool along the longitudinal direction can be constructed compactly even when the supply reel whose diameter is large is applied, and also the exchange interval of the tape can be prolonged since the supply reel containing the tape in a sufficient length can be applied. Thus, the interruption of production caused due to the tape exchange can be reduced, and also a working efficiency can be improved. Further, the direction of the tape unwound from the supply reel is changed into the longitudinal direction of the press-fitting tool by the tape running direction changing portion, and then the tape can be supplied to the area between the press-fitting tool and the substrate. Therefore, the adhesive tape can be affixed properly and stably onto the predetermined locations of the substrate. As a result, such advantages can be achieved in affixing the adhesive tape onto a plurality of predetermined locations that are aligned in parallel at a small pitch interval on the substrate.

BRIEF DESCRIPTION OF THE DRAWINGS

FIG. 7 is an explanatory of positional relationship of the affixing unit in the same embodiment.

FIGS. 8(a) and (b) are perspective views showing states of a substrate before and after ACF affixing steps in the same embodiment.

MODE FOR CARRYING OUT THE INVENTION

Respective embodiments in which an adhesive tape affixing equipment of the present invention is applied to an ACF affixing equipment will be explained with reference to FIG. 1 to FIG. 12 hereinafter.

First Embodiment

First, an ACF affixing equipment according to a first embodiment of the present invention will be explained with reference to FIG. 1 to FIG. 8 hereunder.

Figure 1:
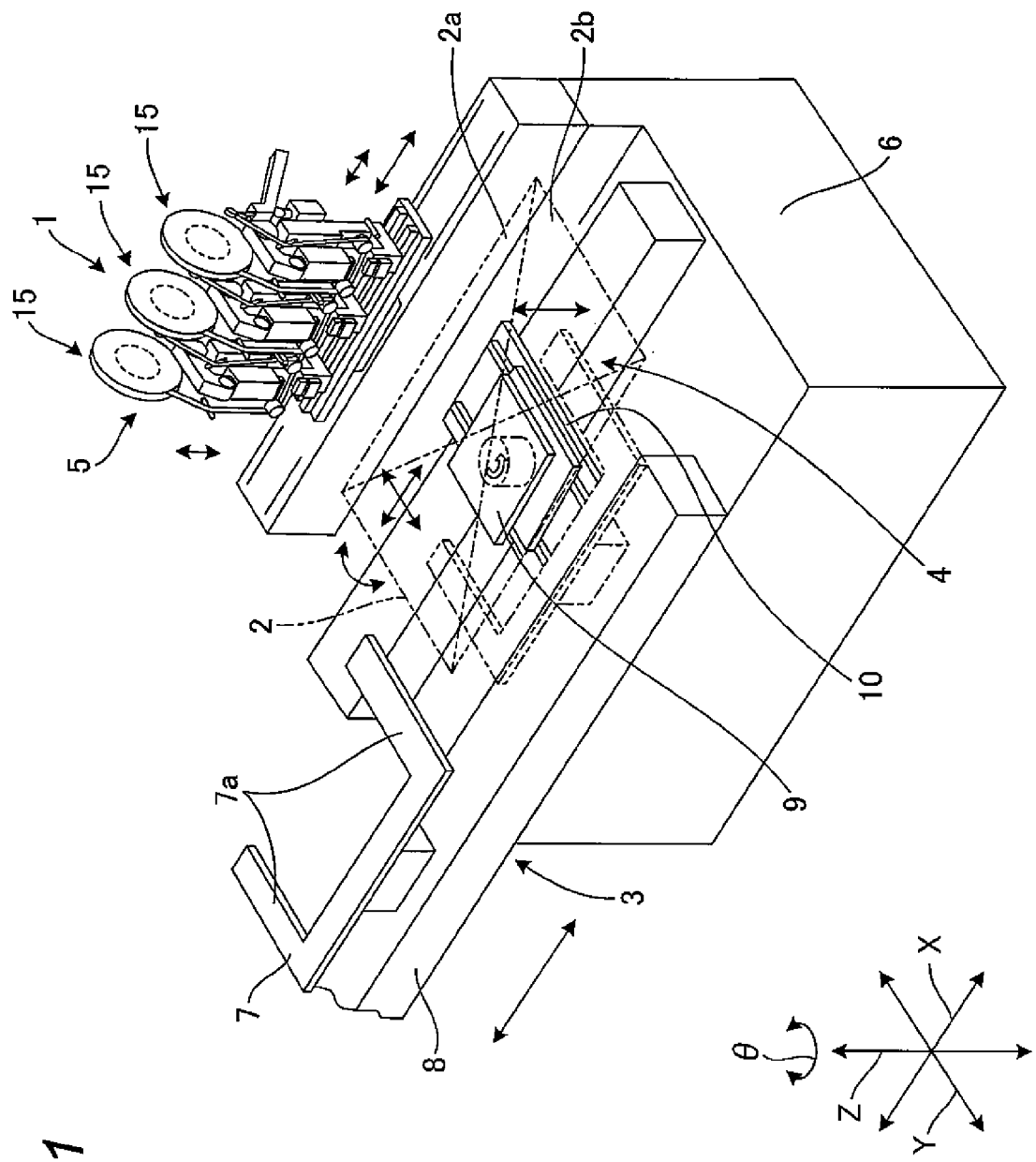
FIG. 1 is a perspective view showing an overall schematic configuration of an ACF affixing equipment according to a first embodiment of the present invention.

In FIG. 1, an ACF affixing equipment 1 includes a substrate carrying means 3 for carrying in a substrate 2 such as a glass substrate, or the like, a transferring means 4 for receiving the substrate 2 from the substrate carrying means 3 and executing a transfer required for an ACF affixing action, and an ACF affixing mechanism portion 5 for applying an ACF affixing action to a plurality of electrodes provided on a side edge portion of the substrate 2 respectively, all being provided on a base 6. Here, a carrying-out of the substrate 2 is executed by a substrate carrying means (not shown) similar to the substrate carrying means 3 and provided to a temporary press-fitting equipment (not shown) in the subsequent step. In the temporary press-fitting equipment, an electronic component is mounted on the electrodes of the substrate 2 onto which the ACF is affixed, and is press-fitted thereto.

The substrate carrying means 3 is constructed by a substrate loading portion 7 equipped with a pair of supporting arms 7a, 7b for loading the substrate 2 thereon and supporting it in a fixed-beam mode, and a driving mechanism 8 for moving reciprocally the substrate loading portion 7 in the X-direction as the substrate carrying direction. Also, the transferring means 4 is constructed by a substrate holding portion 9 for loading the substrate 2 thereon and supporting it, and a transferring table 10 for moving and positioning the substrate holding portion 9 in the X-direction as the carrying direction of the substrate 2, the Y-direction intersecting orthogonally with the X-direction, the Z-direction perpendicular to both directions, and the θ-direction around the Z-direction. This transferring means 4 is constructed to position two side edge portions 2a, 2b (see FIG. 8(a)), which are located adjacently mutually like an L-shape on the substrate 2, sequentially in the ACF affixing positions given by the ACF affixing mechanism portion 5 described later, while holding the substrate 2 on the substrate holding portion 9. In an example of the substrate 2 of the present embodiment, as shown in FIG. 8(a), three electrodes 11 on the source side are arranged on one side edge portion 2a whereas two electrodes 11 on the gate side are arranged on the other side edge portion 2b and, as shown in FIG. 8(b), an ACF 12 is affixed to these electrodes 11 respectively and then the substrate 2 is carried out to the subsequent steps.

Figure 2:
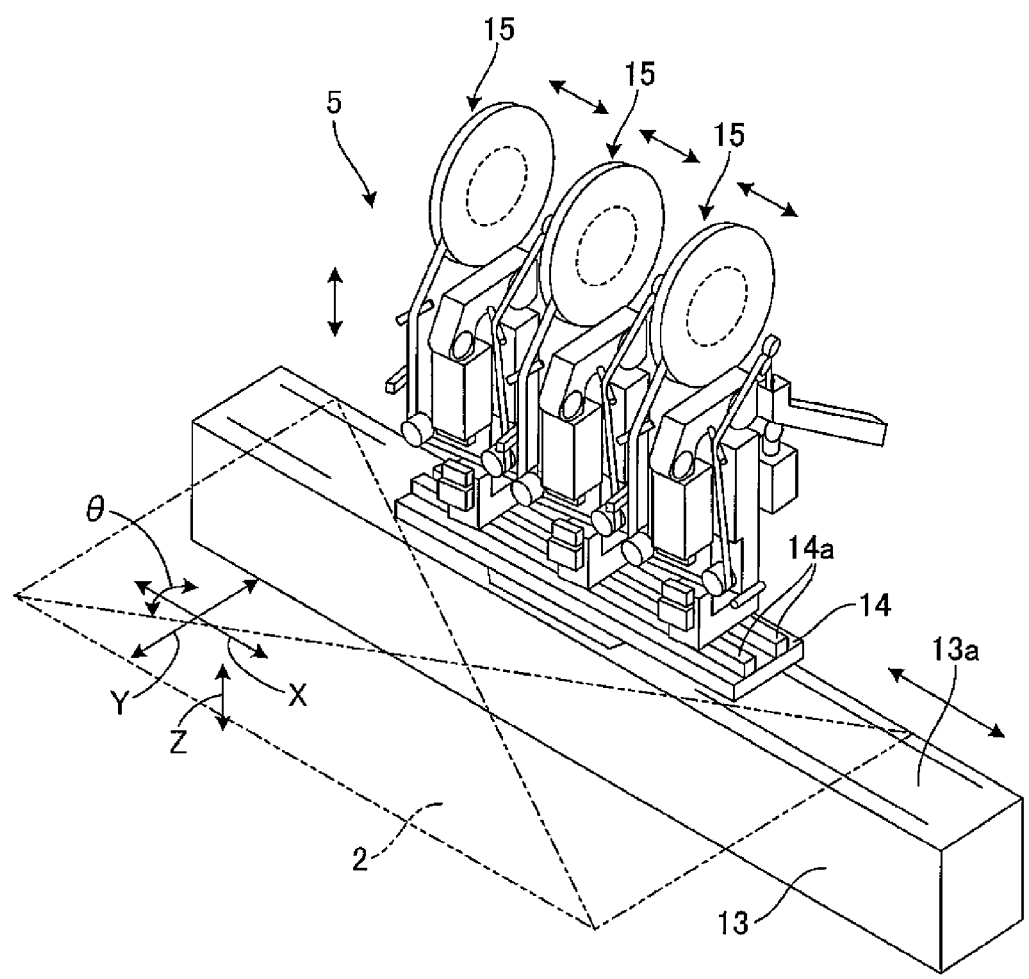
FIG. 2 is a pertinent enlarged perspective view of FIG. 1.

As shown in FIG. 2, the ACF affixing mechanism portion 5 is constructed such that a movable table 14 provided to a supporting table 13 being provided to extend in the X-direction can be moved and positioned in the X-direction by a driving means 13a and that three ACF affixing units 15 can be moved and positioned independently in the X-direction on the movable table 14. Each ACF affixing unit 15 is constructed such that this unit can be supported movably along guide rails 14a being provided to the movable table 14 to extend in the X-direction and also can be moved and positioned by a driving mechanism (not shown) provided independently. In this manner, an alignment interval between the ACF affixing units 15 is set on the movable table 14, and also the whole position of these units is set based on the movement/positioning of the movable table 14. Here, it is explained that the alignment interval between the ACF affixing units 15 is set on the movable table 14. But the movable table 14 is not provided, and respective ACF affixing units 15 provided on the supporting table 13 may be moved and positioned by the driving means 13a or may be moved and positioned in the X-direction by the driving means being provided to the ACF affixing units 15 respectively.

Figure 3:
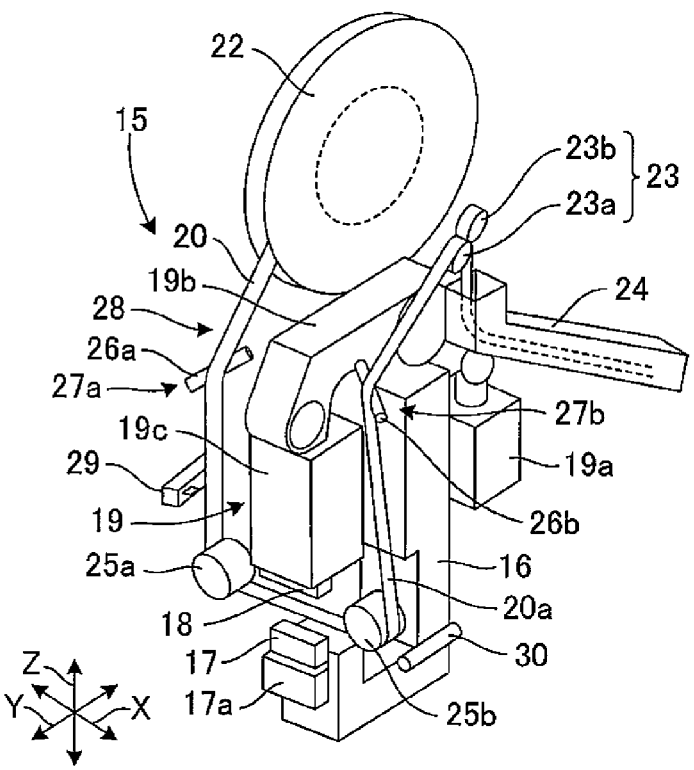
FIG. 3 is a perspective view of an affixing unit in the same embodiment.
Figure 4:
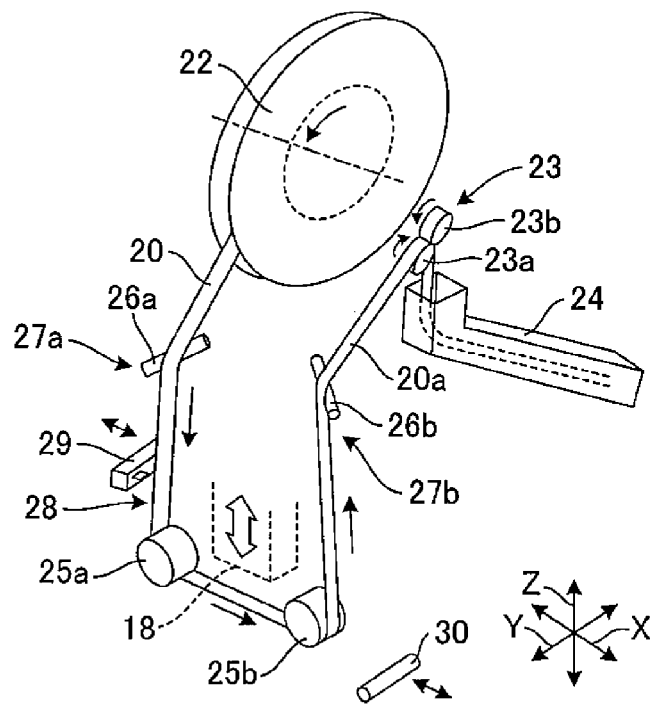
FIG. 4 is a perspective view explaining an operation of an affixing unit in the same embodiment.

In the ACF affixing unit 15, as shown in FIG. 3 and FIG. 4, a receiving member 17 for receiving the side edge portions 2a, 2b of the substrate 2 from the bottom is provided to the front portion of the lower portion of a main body portion 16 such that this member can be moved between the supporting position, in which the side edge portions 2a, 2b of the substrate 2 are supported from the bottom, and the standby position by an operating means 17a. A press-fitting tool 18 is provided just over the receiving member 17 to oppose to this receiving member 17. The press-fitting tool 18 is constructed such that a press-fitting tool operating means 19 can apply the pressurizing and separating operations to the receiving member 17. The press-fitting tool operating means 19 is constructed by a cylinder unit 19a provided at the back of the main body portion 16 in the Y-direction, a lever/link mechanism 19b, and a sliding mechanism 19c provided in the front of the main body portion 16 in the Y-direction to support the press-fitting tool 18 vertically movably.

A supply reel 22 on which a tape 20 (see FIG. 5, FIG. 6), which is composed by laminating an ACF tape 21 on a separator tape 20a, is wound is provided along the Y-direction that intersects orthogonally with the longitudinal direction of the press-fitting tool 18, and is supported rotatably around the horizontal axis in the X-direction. A tape running means 23 and an eject duct 24 are provided to the upper portion on the other side at the back of the main body portion 16. The tape running means 23 for feeding the tape is constructed by a running/driving roller 23a and a pinch roller 23b. This tape running means 23 is constructed such that the tape 20 can be pulled out from the supply reel 22 by turning/driving the running/driving roller 23a by a predetermined amount in a state that the separator tape 20a is sandwiched between both rollers 23a, 23b and can be fed intermittently by a predetermined length corresponding to a length of the electrode 11.

A tape running route setting means 28 is provided to set the tape running route that reaches the tape running means 23 from the supply reel 22 to pass through the area between the press-fitting tool 18 and the substrate 2 on the receiving member 17. This tape running route setting means 28 is constructed by a pair of running rollers 25a, 25b provided on both side positions of the press-fitting tool 18 in the X-direction, and oblique rollers 26a, 26b provided over these running rollers 25a, 25b. The running rollers 25a, 25b are provided in the upper positions higher than the side edge portions 2a, 2b of the substrate 2 on the receiving member 17 but the lower positions lower than the standby position of the press-fitting tool 18.

The oblique roller 26a is arranged rotatably around an axis center that is inclined to both the running face of the tape, which is pulled out from the supply reel 22 on the supply side, and the running face of the tape, which is wound between the running rollers 25a, 25b on the press-fitting tool 18 side. The oblique roller 26a constitutes a tape running direction changing portion 27a that changes the running face of the tape from the Y-direction to the X-direction. Also, the oblique roller 26b is arranged rotatably around an axis center that is inclined to both the running face of the tape, which is wound on the running roller 25b, and the running face of the tape, which is wound on the running/driving roller 23a of the tape running means 23. The oblique roller 26b constitutes a tape running direction changing portion 27b that changes the running face of the tape from the X-direction to the Y-direction. Also, the oblique roller 26a is arranged on the inner side of the tape running route on the press-fitting tool 18 side, when viewed from the tape side, in the tape running route that reaches the running roller 25a from the supply reel 22. The oblique roller 26a is constructed such that this oblique roller comes in touch with the separator tape 20a side of the tape 20 to do a turn of the running face of the tape 20.

Also, as shown in FIG. 5, a cutter 29 for cutting the ACF tape 21 into every length corresponding to the length of the electrode 11 is provided on the outer side of the tape running route between the oblique roller 26a and the running roller 25a. Also, a releasing mechanism 30 for releasing the separator tape 20a from the ACF 12 affixed on the electrode 11 when this mechanism is moved reciprocally between the side edge portion of the substrate 2 on the receiving member 17 and the press-fitting tool 18 in the longitudinal direction is provided. Here, the ACF 12 signifies the ACF tape 21 that is cut into a predetermined length and affixed onto the electrode 11.

Figure 5A:
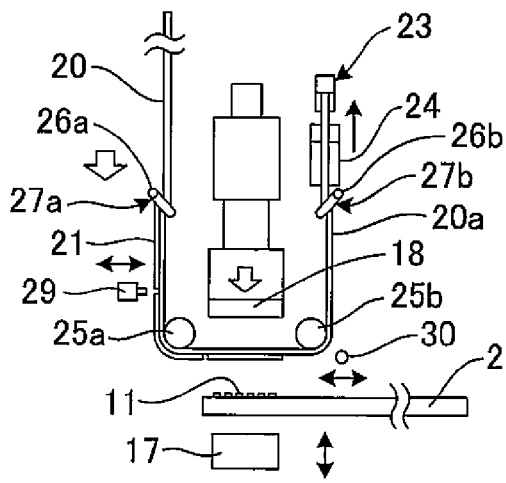
FIGS. 5(a) to (c) are explanatory views of ACF affixing steps in the same embodiment.
Figure 5B:
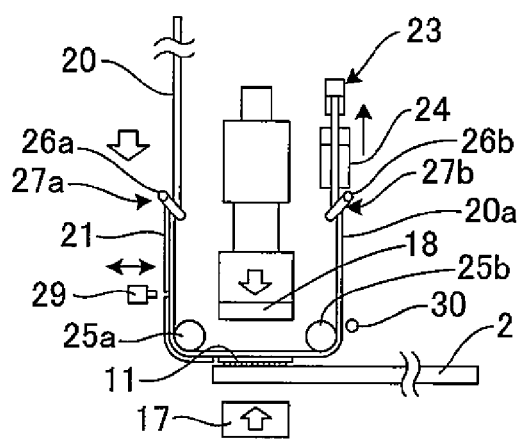
Figure 5C:
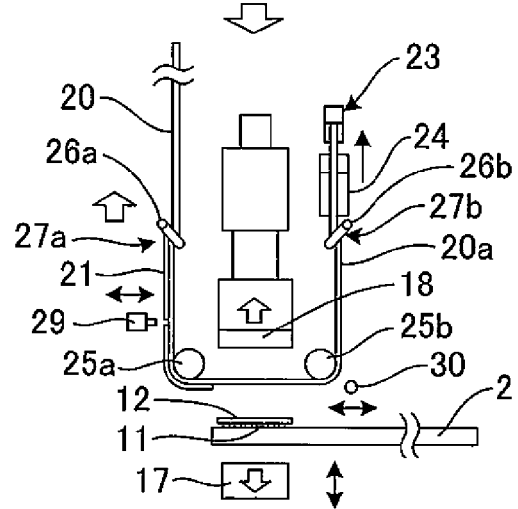

An affixing operation for the ACF 12 executed by the ACF affixing unit 15 constructed in this way will be explained with reference to FIG. 5 hereunder. First, as shown in FIG. 5(a), the substrate 2 is positioned such that the electrodes 11 are positioned between the receiving member 17 and the press-fitting tool 18, and then the tape 20 is pitch-fed by the tape running means 23 such that the ACF tape 21 being cut into the length corresponding to the length of the electrodes 11 by the cutter 29 is positioned opposedly on the electrodes 11. Then, as shown in FIG. 5(b), the press-fitting tool 18 is moved downward in a state that the portion of the substrate 2 on which the electrodes 11 are arranged is supported from the bottom by the receiving member 17, then the ACF tape 21 is pushed against the electrodes 11 of the substrate 2, which is supported by the receiving member 17, by the press-fitting tool 18 via the separator tape 20a, and thus the ACF tape 21 is press-fitted to the electrodes 11. Then, as shown in FIG. 5(c), a clearance is created between the substrate 2 and the press-fitting tool 18 by moving upward the press-fitting tool 18, then the separator tape 20a is released from the ACF tape 21 being affixed onto the electrodes 11 by operating the releasing mechanism 30, and thus such a state is obtained that the ACF 12 is affixed onto the electrodes 11.

Next, the steps of affixing the ACF 12 (ACF tape 21) onto the electrodes 11 being provided onto the side edge portions 2a, 2b of the substrate 2 by the ACF affixing equipment 1 constructed as above will be explained with reference to FIG. 1, FIG. 2, a flowchart of FIG. 6, and FIG. 7, FIG. 8 hereunder. First, the substrate 2 shown in FIG. 8(a) is carried by the substrate carrying means 3, and one side edge portion 2a of the substrate 2 is positioned on the ACF affixing mechanism portion 5 by the transferring means 4. In the ACF affixing mechanism portion 5, respective affixing units 15 are positioned by moving the movable table 14 and each affixing unit 15 such that the press-fitting tool 18 of each affixing unit 15 is positioned to oppose to three electrodes 11 (source side electrodes) provided to one side edge portion 2a respectively. At this time, a width dimension of the affixing unit 15 is constructed compactly because the supply reel 22 is arranged to intersect substantially orthogonally with the longitudinal direction of the press-fitting tool 18. Therefore, as shown in FIG. 7, an alignment pitch HP1 of the affixing units 15 can be caused to coincide with an alignment pitch P of the electrodes 11. Then, as described above, the ACF 12 is affixed onto the electrodes 11 on one side edge portion 2a by each affixing unit 15. Then, the other side edge portion 2b of the substrate 2 is positioned on the ACF affixing mechanism portion 5 by turning the substrate 2 by means of the transferring means 4. In the ACF affixing mechanism portion 5, two affixing units 15 are positioned by moving the movable table 14 and each affixing unit 15 such that the press-fitting tools 18 of these unit units are opposed to two electrodes 11 (gate side electrodes) provided on the other side edge portion 2b respectively and remaining one affixing unit 15 is positioned such that this unit is positioned in the standby position as the position where the ACF 12 (ACF tape 21) is not affixed onto the electrodes 11 of the substrate 2. Then, the ACF 12 is affixed onto the electrodes 11 on the other side edge portion 2b by each affixing unit 15. Then, the substrate 2 in which the ACF 12 is affixed onto the electrodes 11 on both side edge portions 2a, 2b is carried out.

As described above, according to the present embodiment, the supply reel 22 is arranged to intersect substantially orthogonally with the longitudinal direction of the press-fitting tool 18 in each affixing unit 15. Accordingly, a width dimension along the longitudinal direction of the press-fitting tool 18 can be constructed compactly even when the supply reel 22 whose diameter is large is applied, and the exchanging interval of the tape 20 can be prolonged since the supply reel 22 containing the tape whose length is sufficient can be applied. Also, an interruption of production caused due to the tape exchange can be reduced, and also a working efficiency can be improved. In addition, the tape is unwound from the supply reel 22 to change its direction toward the longitudinal direction of the press-fitting tool 18 by using the tape running direction changing portion 27a, and then this tape is supplied to the area between the press-fitting tool 18 and the substrate 2. Therefore, the ACF 12 can be affixed properly and stably onto the electrodes 11 of the substrate 2. As a result, a great advantage can be achieved in improving the working efficiency of the affixing work of the ACF 12 onto a plurality of electrodes 11 that are arranged in parallel at a small pitch interval on the substrate 2.

Also, the tape running direction changing portion 27a for the tape running route that reaches the press-fitting tool 18 from the supply reel 22 is arranged on the inner side of the tape running route located on the press-fitting tool 18 side, when viewed from the tape side. Therefore, the direction of the tape 20 is turned because the tape running direction changing portion 27a comes into touch with the separator tape 20a side of the tape 20. As a result, the direction of the tape 20 can be turned properly not to exert the influence upon the adhesive ACF tape 21.

Also, the tape running direction changing portion 27a is constructed by the oblique roller 26a that can be rotated around the axis center being inclined to the tape running faces on the supply reel 22 side and the press-fitting tool 18 side. Therefore, the direction of the tape can be turned properly by a simple configuration that is constructed merely by arranging obliquely the roller. Also, since the tape running direction changing portion 27b on the eject side is also constructed by the oblique roller 26b, the similar advantage can also be achieved.

Also, in the ACF affixing mechanism portion 5 of the present embodiment, a plurality (in the illustrated example, three) of affixing units 15 are aligned in row in the carrying direction of the substrate 2, and are constructed such that these units can be moved and positioned independently respectively. Therefore, since the aligned positions of a plurality of affixing units 15 are set to coincide with the alignment pitch of the electrodes 11 being arranged on the side edge portions 2a, 2b of the substrate 2, the ACF 12 can be affixed at a time onto a plurality of electrodes 11, and also such a situation can be easily handled that the kind of the substrate 2 is changed. Also, since three affixing units 13 or more are provided and the press-fitting tools 18 are operated at the same time respectively, the ACF can be affixed onto respective electrodes 11 simultaneously by the collective operation even though three electrodes 11 or more are arranged in parallel on the side edge portions of the substrate 2.

Second Embodiment

Figure 9:
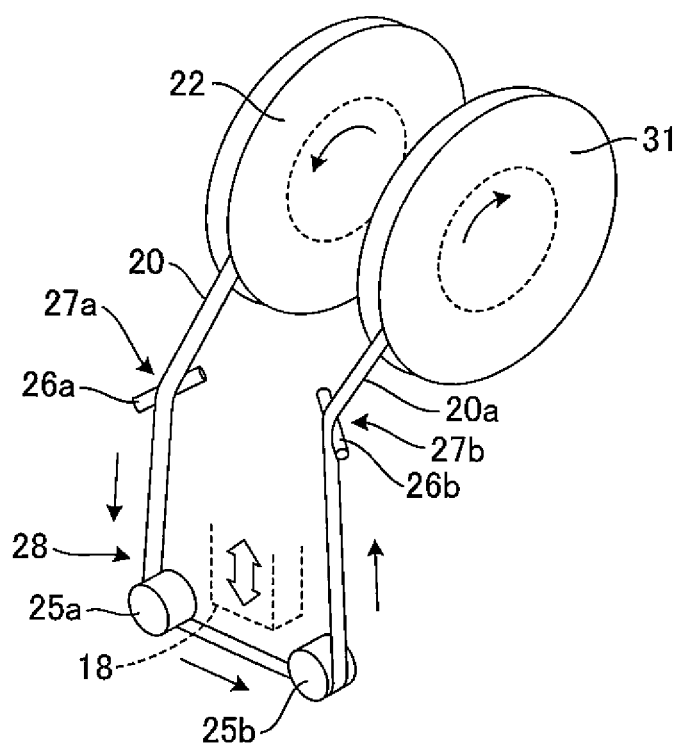
FIG. 9 is a perspective view showing a schematic configuration of pertinent portions of an ACF affixing equipment according to a second embodiment of the present invention.

Next, an ACF affixing equipment according to a second embodiment of the present invention will be explained with reference to FIG. 9 hereunder. In the explanation of following embodiments, the explanation of the same constituent elements as those in the first embodiment will be omitted by affixing the same reference symbols to them, and merely the differences will be explained mainly hereunder.

In the first embodiment, the example in which the recovery portion of the separator tape 20a is constructed by the tape running means 23 and the eject duct 24 is illustrated. In the present embodiment, the recovery portion is constructed by a recovery reel 31 that is provided to intersect orthogonally with the longitudinal direction of the press-fitting tool 18, like the supply reel 22. Therefore, when the supply of the tape 20 executed by the supply reel 22 and the winding/recovery of the separator tape 20a executed by the recovery reel 31 are executed in synchronism with each other, the tape 20 can be pitch-fed by a predetermined length corresponding to the length of the electrodes 11. According to such configuration, the similar advantages to those of the above embodiments can be achieved.

Third Embodiment

Figure 10:
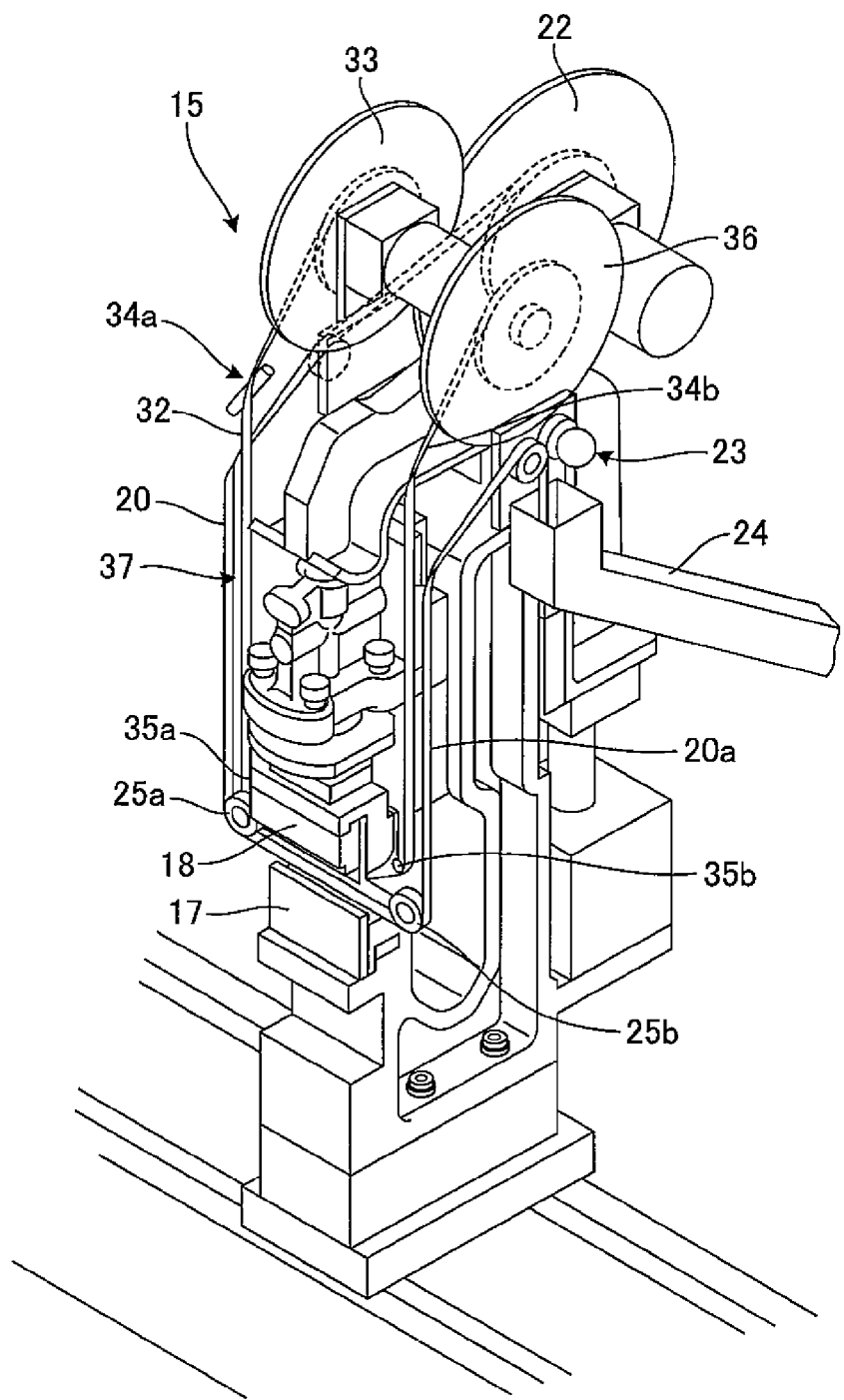
FIG. 10 is a perspective view of an affixing unit of an ACF affixing equipment according to a third embodiment of the present invention.

Next, an ACF affixing equipment according to a third embodiment of the present invention will be explained with reference to FIG. 10 hereunder.

In the first embodiment, the example in which the tape 20 is supplied to the area between the press-fitting tool 18 and the substrate 2 from the supply reel 22 is illustrated. In the present embodiment, as shown in FIG. 10, a protection tape 32 is supplied to the area between the press-fitting tool 18 and the tape 20, in addition to the above. More particularly, a protection tape supply reel 33 on which the protection tape 32 is wound is arranged in parallel with the supply reel 22 such that this supply reel 33 is displaced longitudinally from the side portion of the supply reel 22 in such an attitude that this supply reel 33 intersects substantially orthogonally with the longitudinal direction of the press-fitting tool 18, then the protection tape 32 is unwound from the protection tape supply reel 33 to change its running face by using a tape running direction changing portion 34a, then this protection tape 32 is arranged along the opposing face of the press-fitting tool 18 to the substrate 2 via a guide roller 35a being arranged on one side of the press-fitting tool 18, and then this protection tape 32 is wound/recovered by a protection tape recovery reel 36 via a guide roller 35b and a tape running direction changing portion 34b being arranged on the other side of the press-fitting tool 18. A protection tape running route setting means 37 is constructed by the tape running direction changing portions 34a, 34b and the guide rollers 35a, 35b. Also, like the first embodiment, when the tape running changing portion is constructed by the oblique rollers that can be rotated around the axis center being inclined to both running surfaces of the tape on the supply reel side, on which the tape is unwound from the supply reel 33, and the press-fitting head side on which the tape is wound between the tape running face and the guide rollers 35a, 35b, the tape running direction changing portions 34a, 34b can change the direction of the tape running face properly by using a simple configuration that is obtained by positioning obliquely the roller.

According to the present embodiment, the protection tape 32 is arranged on the press-fitting face that faces to the substrate 2 of the press-fitting tool 18. Therefore, when the tape 20 on which the ACF tape 21 is laminated in a state that the protection tape 32 is interposed is press-fitted onto the electrodes of the substrate 2, such a situation can be prevented that the protruded ACF tape 21 adheres onto the press-fitting surface of the press-fitting tool 18 to contaminate it, and also the variation in parallelism between the press-fitting tool 18 and the substrate 2 can be absorbed. Also, the advantages similar to those of the first embodiment can be achieved even by the configuration to which the protection tape 32 is further provided.

Fourth Embodiment

Figure 11:
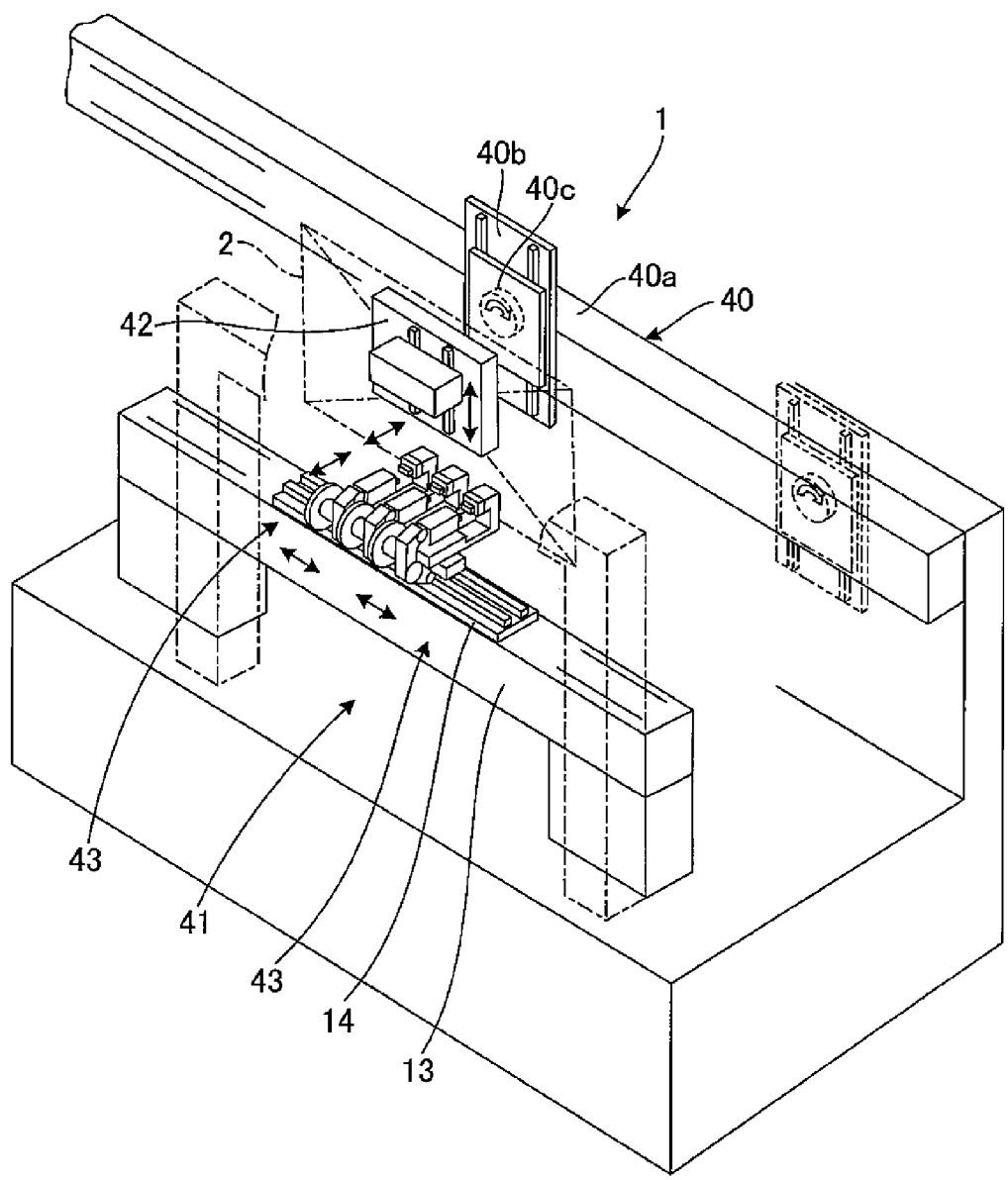
FIG. 11 is a perspective view showing an overall schematic configuration of an ACF affixing equipment according to a fourth embodiment of the present invention.

Next, an ACF affixing equipment according to a fourth embodiment of the present invention will be explained with reference to FIG. 11 and FIG. 12 hereunder.

In the above embodiments, an example in which the ACF 12 (ACF tape 21) is affixed onto the electrodes 11 of the substrate 2 that is carried in a horizontal attitude is illustrated. In contrast, the present embodiment is constructed such that the ACF 12 (ACF tape 21) is affixed onto the electrodes 11 of the substrate 2 that is carried in a vertical attitude. Concretely, as shown in FIG. 11, an ACF affixing equipment 41 equipped with a plurality of affixing units 15 that are arranged to oppose to predetermined locations of a substrate carrying means 40, which sucks/holds the substrate 2 in a vertical attitude and carries it, in the horizontal direction is provided. In the substrate carrying means 40, a substrate holding portion 40c, which is moved vertically and turned around the horizontal axis while sucking/holding the substrate 2 and is moved forward/backward to/from the ACF affixing equipment 41 to transfer the substrate 2, is provided to a moving body 40b that can be moved/positioned along a carrying rail 40a. The ACF affixing equipment 41 is constructed by a substrate holding/elevating means 42 moved vertically while holding the substrate 2 that is transferred from the substrate carrying means 40, and an ACF affixing mechanism portion 43.

Figure 12:
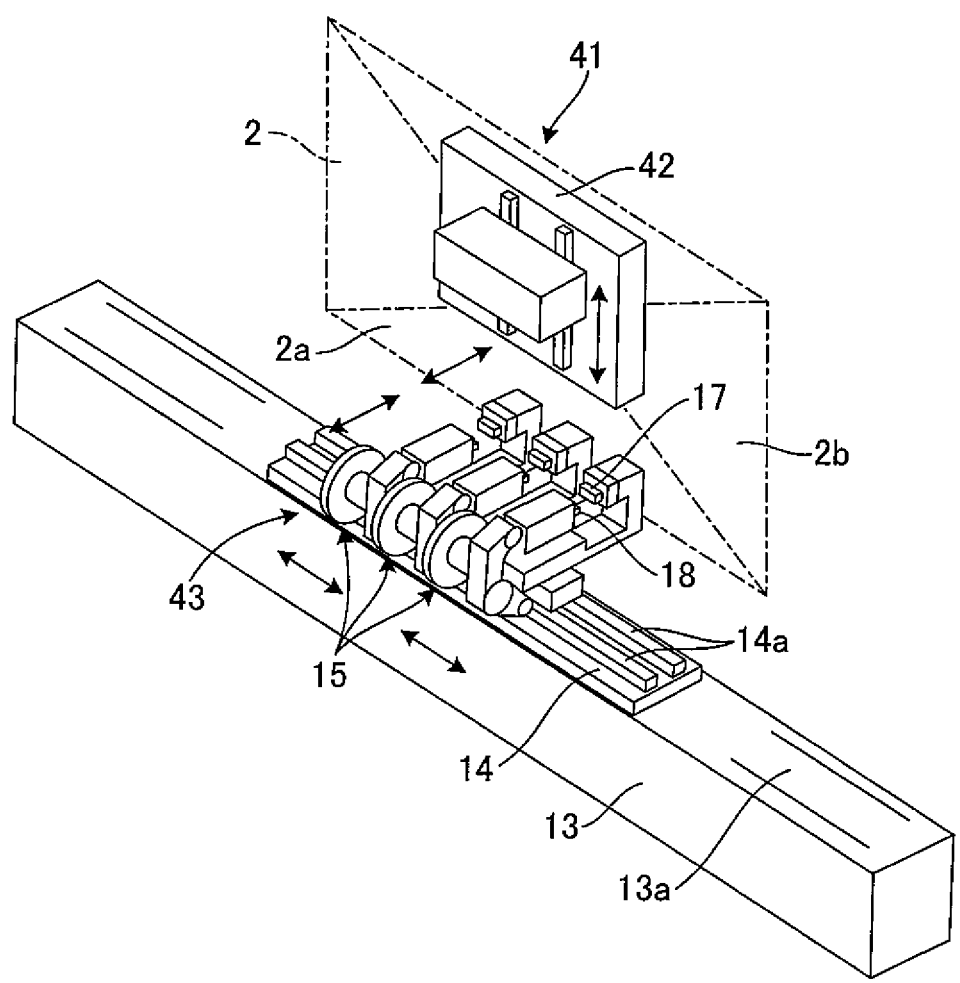
FIG. 12 is a pertinent enlarged perspective view of FIG. 11.
Figure 13A:
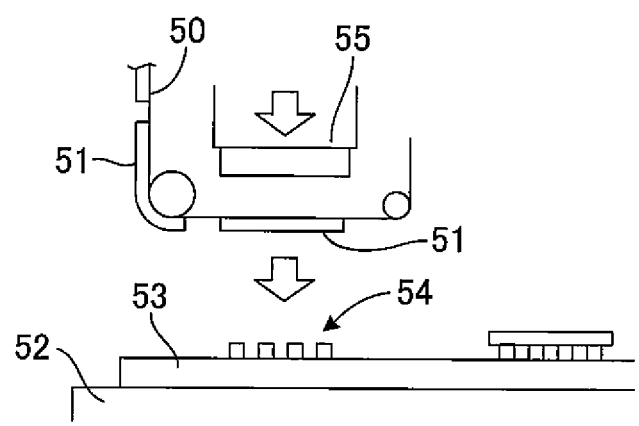
FIGS. 13(a) and (b) are explanatory views of an ACF affixing step.
Figure 13B:
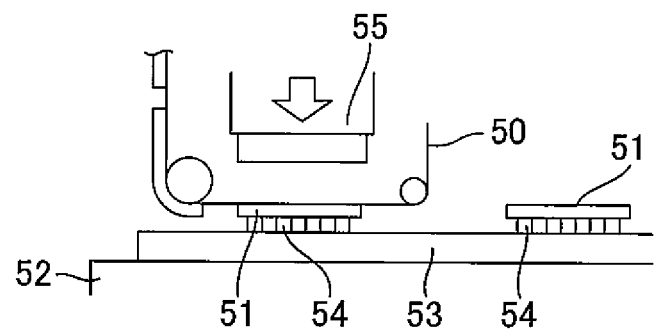
Figure 14:
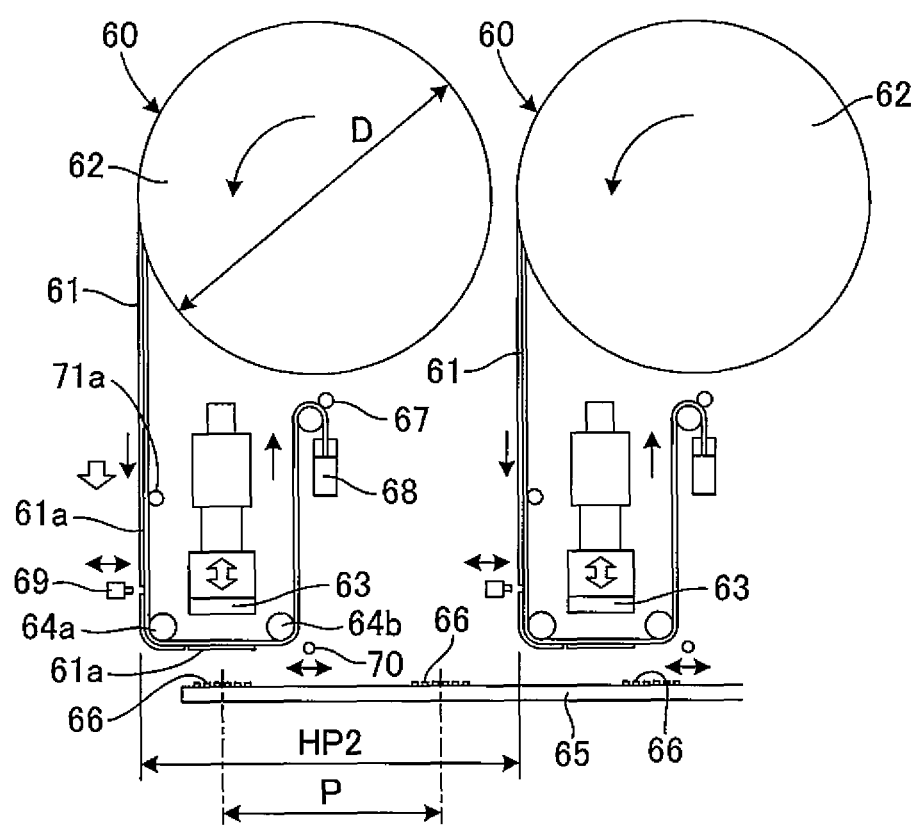
FIG. 14 is a schematic configurative view of an ACF affixing equipment in the prior art.

As shown in FIG. 12, in the ACF affixing mechanism portion 43, the movable table 14 is provided onto the supporting table 13 to be moved and positioned in the X-direction, and three affixing units 15 are provided in a horizontal attitude onto the movable table 14. Each ACF affixing unit 15 is constructed such that this unit can be moved and positioned independently along the guide rail 14a on the movable table 14. In this manner, the alignment interval between respective ACF affixing units 15 is set on the movable table 14, and also the whole position of them is set by the movable table 14. The ACF affixing unit 15 is constructed in a horizontal attitude such that the receiving member 17 and the press-fitting tool 18 are opposed to each other in the horizontal direction, the side edge portions 2a, 2b of the substrate 2 held by the substrate holding/elevating means 42 are inserted sequentially into the area between them from the upper side, the electrodes 11 provided onto these side edge portions 2a, 2b are positioned to oppose to the receiving member 17 and the press-fitting tool 18, and the affixing operation of the ACF 12 is executed in this state. In this case, it is explained that the alignment interval between respective ACF affixing units 15 is set on the movable table 14. But such a configuration may be employed that respective ACF affixing units 15 provided onto the supporting table 13 should be moved and positioned in the X-direction without the movable table 14.

Figure 6:
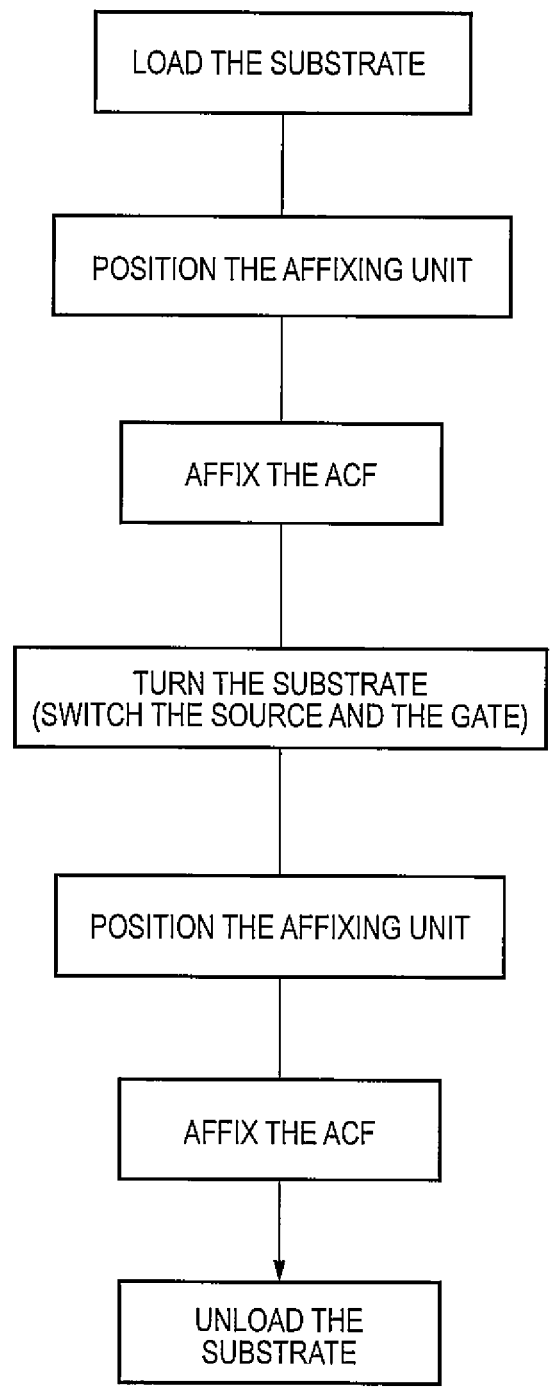
FIG. 6 is an operational flowchart of ACF affixing steps in the same embodiment.

In the present embodiment, the substrate 2 carried to the predetermined position by the substrate carrying means 40 is received by the substrate holding/elevating means 42 and put down to the predetermined position such that respective electrodes 11 on one side edge portion 2a are positioned to respective ACF affixing units 15 and the ACF 12 is affixed onto the electrodes, then the substrate 2 is transferred to the substrate carrying means 40 by lifting up the substrate holding/elevating means 42, then the substrate 2 is turned by the substrate holding portion 40c to position downward the side edge portion 2b, then the substrate 2 is transferred to the substrate holding/elevating means 42 once again, then respective electrodes 11 on the other side edge portion 2b are positioned to respective ACF affixing units 15 and the ACF 12 is affixed onto the electrodes like the above, then the substrate 2 is transferred to the substrate carrying means 40 by lifting up the substrate holding/elevating means 42, and then the substrate 2 is restored/turned to the original attitude by the substrate holding portion 40c and is carried out toward the subsequent steps, whereby the ACF affixing steps are carried out in conformity with the operational flowchart shown in FIG. 6. Therefore, the advantages similar to those of the first embodiment can be achieved.

Here, in the explanation in the above embodiments, the example in which the ACF 12 is affixed onto the electrodes 11 provided onto the side edge portions 2a, 2b of the substrate 2 is illustrated. But the affixed tape is not limited to the ACF (anisotropic conductive material) tape 21. The nonconductive adhesive tape or adhesive material may be applied, and the electronic component having the projection electrodes may be mounted on the electrodes of the substrate by the adhesive tape.

Also, in the above embodiments, the example in which the present invention is applied to the ACF affixing equipment is illustrated. But the similar advantages can be achieved when the configuration according to the protection tape 32 shown in the third embodiment is applied to the press-fitting equipment that press-fits the press-fitted component such as the electronic component mounted on the electrodes 11 of the substrate 2 by applying a heat and a pressure to the component by using the press-fitting tool 18.

The present invention is explained in detail with reference to the particular embodiments. But it is apparent for those skilled in the art that various variations and modifications can be applied without departing from a spirit and a scope of the present invention.

This application is based upon Japanese Patent Application (Patent Application No. 2009-012269) filed on Jan. 22, 2009; the contents of which are incorporated herein by reference.

INDUSTRIAL APPLICABILITY

In the present invention, the supply reel is arranged to intersect substantially orthogonally with the longitudinal direction of the press-fitting tool. Therefore, a width dimension of the press-fitting tool along the longitudinal direction can be constructed compactly even when a diameter of the supply reel is large, and also the exchange interval of the tape can be prolonged. Thus, the interruption of production caused due to the tape exchange can be reduced, and a working efficiency can be improved. Further, the direction of the tape unwound from the supply reel is changed into the longitudinal direction of the press-fitting tool by the tape running direction changing portion, and thus the tape can be supplied properly and stably to the area between the press-fitting tool and the substrate. Therefore, the present invention can be utilized preferably in the ACF affixing equipment that affixes the ACF onto a plurality of electrodes arranged on the side edge portions of the substrate or the press-fitting equipment that press-fits the press-fitted component via the protection tape.

DESCRIPTION OF REFERENCE NUMERALS AND SIGNS

1 ACF affixing equipment (adhesive tape affixing equipment)
2 substrate
5 ACF affixing mechanism portion
12 ACF
15 affixing unit
18 press-fitting tool
19 press-fitting tool operating means
20 tape
20a separator tape
21 ACF tape (adhesive tape)
22 supply reel
23 tape running means
26a, 26b oblique roller
27a, 27b tape running direction changing portion
28 tape running route setting means
32 protection tape
33 protection tape supply reel
34a, 34b tape running direction changing portion
37 protection tape running route setting means
41 ACF affixing equipment (adhesive tape affixing equipment)
43 ACF affixing mechanism portion

The invention claimed is:

1. An adhesive tape affixing equipment for pulling out a tape from a supply reel on which the tape constructed by laminating an adhesive tape on a separator tape is wound, and then affixing the adhesive tape onto predetermined locations of a substrate by pushing the tape by means of a press-fitting tool,
   wherein a radial direction of the supply reel is arranged to intersect in a direction that is substantially orthogonal to a longitudinal direction of the press-fitting tool during said affixing of the adhesive tape by the press-fitting tool, and
   a tape running route setting means for causing the tape pulled out from the supply reel to run through an area between the press-fitting tool and the substrate along the longitudinal direction of the press-fitting tool via a tape running direction changing portion being provided to at least one location.

2. The adhesive tape affixing equipment according to claim 1, wherein the tape running direction changing portion is arranged on an inner side of a tape running route on a press-fitting tool side, when viewed from a tape side, in a tape running route that reaches the press-fitting tool from the supply reel.

3. An adhesive tape affixing equipment for pulling out a tape from a supply reel on which the tape constructed by laminating an adhesive tape on a separator tape is wound, and then affixing the adhesive tape onto predetermined locations of a substrate by pushing the tape by means of a press-fitting tool,
   wherein a radial direction of the supply reel is arranged to intersect in a direction that is substantially orthogonal to a longitudinal direction of the press-fitting tool during said affixing of the adhesive tape by the press-fitting tool,
   a tape running route setting means for causing the tape pulled out from the supply reel to run through an area between the press-fitting tool and the substrate along the longitudinal direction of the press-fitting tool via a tape running direction changing portion being provided to at least one location, and
   wherein the tape running direction changing portion is constructed by oblique rollers that are rotated around an axis center being inclined to both running surfaces of the tape on a supply reel side and a press-fitting head side.

4. The adhesive tape affixing equipment according to claim 1, wherein a plurality of affixing units, each including the press-fitting tool, a press-fitting tool operating means for causing the press-fitting tool to execute pressurizing and separating operations that are applied to affix an adhesive tape onto predetermined locations of the substrate, the supply reel, the tape running route setting means, and a tape running means for executing a feed of the tape, are provided to independently move and position adhesive tape to be affixed onto respective predetermined locations.

5. The adhesive tape affixing equipment according to claim 4, wherein three affixing units or more are aligned in one row in a carrying direction of the substrate.

6. The adhesive tape affixing equipment according to claim 5, wherein the affixing units enable the respective press-fitting tools to operate simultaneously.

7. The adhesive tape affixing equipment according to claim 1, wherein a protection tape supply reel on which a protection tape that is interposed between the press-fitting tool and the tape is wound has a radial direction arranged to intersect in a direction that is substantially orthogonal to the longitudinal direction of the press-fitting tool during said affixing of the adhesive tape by the press-fitting tool, and
   a protection tape running route setting means for causing the protection tape being pulled out from the protection tape supply reel to run through an area between the press-fitting tool and the tape along the longitudinal direction of the press-fitting tool via the tape running direction changing portion provided to at least one location is provided.

8. A press-fitting equipment for pulling out a protection tape from a protection tape supply reel on which the protection tape is wound, and then press-fitting a press-fitted component to a substrate with the protection tape interposed between the substrate and a press-fitting tool,
   wherein a radial direction of the protection tape supply reel is arranged to intersect in a direction that is substantially orthogonal to a longitudinal direction of the press-fitting tool during said press-fitting of the press-fitted component, and
   a protection tape running route setting means for causing the protection tape being pulled out from the protection tape supply reel to run through an area between the press-fitting tool and the press-fitted component along the longitudinal direction of the press-fitting tool via the tape running direction changing portion provided to at least one location is provided.

9. The adhesive tape affixing equipment according to claim 1,
   wherein the tape running direction changing portion that changes a direction of the tape unwound from the supply real toward the longitudinal direction of the press-fitting tool for supplying the tape to an area between the press-fitting tool and the substrate.

10. The adhesive tape affixing equipment according to claim 1,
    wherein the radial direction of the supply reel is configured to reduce a width dimension along the longitudinal direction of the press-fitting tool without reducing a size of the supply reel.

11. The adhesive tape affixing equipment according to claim 1,
    wherein the radial direction of the supply reel is configured to reduce an alignment pitch between a plurality of adhesive tape affixing equipment, and
    wherein the alignment pitch between the plurality of adhesive tape affixing equipment is not increased by an increased diameter of the supply reel.

12. The adhesive tape affixing equipment according to claim 1,
    wherein the adhesive tape is anisotropic conductive tape (ACF).

13. The adhesive tape affixing equipment according to claim 1,
    wherein said affixing the adhesive tape onto the predetermined locations of a substrate also comprises the adhesive tape affixing equipment removing the separator tape from the adhesive tape.

* * * * *